United States Patent
Nam et al.

(10) Patent No.: US 7,254,061 B2
(45) Date of Patent: Aug. 7, 2007

(54) MEMORY DEVICES USING TRI-STATE BUFFERS TO DISCHARGE DATA LINES, AND METHODS OF OPERATING SAME

(75) Inventors: Sang-Wan Nam, Gyeonggi-do (KR); Seung-Keun Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 76 days.

(21) Appl. No.: 11/153,508

(22) Filed: Jun. 15, 2005

(65) Prior Publication Data

US 2006/0092716 A1    May 4, 2006

(30) Foreign Application Priority Data

Nov. 3, 2004 (KR) .................. 10-2004-0088986

(51) Int. Cl.
*G11C 16/00* (2006.01)
(52) U.S. Cl. .............. 365/185.17; 365/185.25; 365/189.05; 365/204
(58) Field of Classification Search ............... 365/204
See application file for complete search history.

(56) References Cited

U.S. PATENT DOCUMENTS

| | | | |
|---|---|---|---|
| 5,396,464 A * | 3/1995 | Slemmer ............... | 365/201 |
| 5,563,835 A * | 10/1996 | Oldham ................ | 365/207 |
| 5,654,926 A | 8/1997 | Kanzaki | |
| 5,870,333 A * | 2/1999 | Matsumoto ........... | 365/185.2 |
| 6,061,266 A | 5/2000 | Tan | |
| 6,377,512 B1 * | 4/2002 | Hamamoto et al. ..... | 365/233 |
| 6,751,116 B2 * | 6/2004 | Kuroda et al. ......... | 365/149 |
| 6,771,548 B2 | 8/2004 | Takahashi | |

FOREIGN PATENT DOCUMENTS

| JP | 9-73779 A | 3/1997 |
|---|---|---|
| JP | 2003-338190 A | 11/2003 |

* cited by examiner

*Primary Examiner*—Tan T. Nguyen
(74) *Attorney, Agent, or Firm*—Myers Bigel Sibley & Sajovec, P.A.

(57) ABSTRACT

A memory device includes a sense amplifier circuit, a tri-state buffer, a data latch circuit and a data line. The sense amplifier circuit senses and amplifies a current of a memory cell. The tri-state buffer receives an output of the sense amplifier circuit. The data latch circuit latches an output of the tri-state buffer. The data line connects the tri-state buffer and the data latch circuit. The memory device removes charge on the data line using a latch enable signal, which is applied to the tri-state buffer before a read operation.

18 Claims, 3 Drawing Sheets

MEMORY DEVICES USING TRI-STATE BUFFERS TO DISCHARGE DATA LINES, AND METHODS OF OPERATING SAME

CROSS-REFERENCE TO RELATED APPLICATIONS

This application claims the benefit under 35 U.S.C. §119 of Korean Patent Application 2004-0088986 filed on Nov. 3, 2004, the disclosure of which is hereby incorporated herein by reference in its entirety as if set forth fully herein.

FIELD OF THE INVENTION

This invention relates to memory devices and operating methods, and more particularly to data line discharging circuits and methods for memory devices.

BACKGROUND OF THE INVENTION

Integrated circuit memory devices are widely used in many consumer, commercial and other applications. Non-volatile memory devices retain their stored data even when their power supplies are interrupted. The category of non-volatile memory devices includes PROM (Programmable ROM), EPROM (Erasable PROM), EEPROM (Electrically EPROM), and Flash Memory devices. These non-volatile memory devices may be used in mobile devices such as digital cameras, cellular phones, PDAs and so forth because they can have low power dissipation.

In addition, these non-volatile memory devices may be classified into two groups according to a structure of a memory cell array. One is a NAND-type flash memory device and the other is a NOR-type flash memory device. Because the NAND-type flash memory has a simple structure, it may provide relatively high memory capacity and relatively low cost as compared with the NOR-type flash memory. The NAND-type flash memory devices have been used for USB storage devices, MP3 Players and so on. In contrast, NOR-type flash memory devices may be capable of high processing speeds, so that they are widely used in cellular phones and other devices, where high processing speeds may be desired.

The NOR-type flash memory device generally removes charges generated in a previous sensing operation before reading data stored in memory cells. A conventional NOR-type flash memory device includes a bitline discharging circuit so as to remove at least some charge stored in a bitline before beginning a read operation. The bitline discharging circuit may include an NMOS transistor connected between a bitline and ground. When a bitline discharging signal is applied to the bitline discharging circuit, at least some residual charge of the bitline may be removed.

Moreover, a conventional NOR-type flash memory device may also include a data line discharging circuit for removing at least some charge stored in a data line before beginning a read operation. The data line discharging circuit may include an NMOS transistor connected between a data line and ground. When a control signal is applied to the data line discharging circuit, at least some residual charge of the data line may be removed.

The data line discharging circuit for discharging the data line may occupy a large area. Furthermore, the data line discharging circuit may also need a control signal for controlling the data line discharging circuit whenever a read operation starts.

SUMMARY OF THE INVENTION

Memory devices, such as NOR-type flash memory devices, according to some embodiments of the invention, include a sense amplifier circuit that is configured to sense and amplify a current of a memory cell. A tri-state buffer is configured to receive an output of the sense amplifier circuit. As is well known to those having skill in the art, a tri-state buffer is an inverting or non-inverting buffer that may be placed in a high impedance state, so as to effectively disconnect its input from its output, in response to a control signal. A data latch circuit is configured to latch an output of the tri-state buffer. The tri-state buffer is configured to initialize the data latch circuit in response to a latch enable signal.

In some embodiments, the latch enable signal is generated before the data latch circuit latches the output of the tri-state buffer. In some embodiments, the tri-state buffer includes an inverter that is configured to invert the output of the sense amplifier circuit. In these embodiments, the inverter may operate in response to the latch enable signal. In other embodiments, the data latch circuit operates in response to the latch enable signal.

Memory devices, such as NOR-type flash memory devices, according to other embodiments of the invention, include a memory cell connected to a bitline, a discharging circuit that is configured to discharge the bitline and a sense amplifier circuit that is configured to sense and amplify a current of the bitline. A tri-state buffer is configured to receive an output of the sense amplifier circuit. A data latch circuit is configured to latch an output of the tri-state buffer and a data line is configured to connect the tri-state buffer and the data latch circuit. The tri-state buffer is configured to discharge the data line in response to a latch enable signal after the bitline discharging circuit discharges the bitline.

In some embodiments, the bitline discharging circuit includes an NMOS transistor that is configured to discharge the bitline in response to a bitline discharge signal. In some embodiments, an output of the sense amplifier circuit is set to a logic high level when the bitline is discharged. In some embodiments, the latch enable signal is generated before the data latch circuit latches the output of the tri-state buffer. Moreover, in some embodiments, the tri-state buffer includes an inverter that is configured to invert the output of the sense amplifier circuit. In these embodiments, the inverter may operate in response to the latch enable signal. Finally, in some embodiments, the data latch signal operates in response to the latch enable signal.

Memory devices according to other embodiments of the present invention include a memory cell, a sense amplifier circuit that is configured to sense an amplifier current of the memory cell and a data latch circuit. A tri-state buffer is configured to connect an output of the sense amplifier circuit to an input of the data latch circuit. In some embodiments, the tri-state buffer and the data latch circuit are both responsive to a common control signal. In some embodiments, the tri-state buffer is configured to discharge the input of the data latch circuit in response to the common control signal. In other embodiments, the tri-state buffer is also configured to discharge the input of the data latch circuit and then to buffer the output of the sense amplifier circuit to the data latch circuit in response to the common control signal. The tri-state buffer also may be configured to invert the output of the sense amplifier circuit.

Methods of operating a memory device that includes a memory cell, a sense amplifier circuit that is configured to sense and amplify a current of the memory cell, a data latch circuit and a tri-state buffer that is configured to operate an output of the sense amplifier circuit to an input of the data latch circuit, may be provided according to other embodiments of the present invention. In these methods, the tri-state buffer is placed in a reduced or low impedance state (for example, a logic "0" level) to discharge the input of the data latch circuit in response to a common control signal that is applied to both the tri-state buffer and the data latch circuit. Thereafter, the output of the sense amplifier circuit may be buffered to the data latch circuit in response to the common control signal. Inverting of the sense amplifier output also may take place.

DETAILED DESCRIPTION

Figure 1:
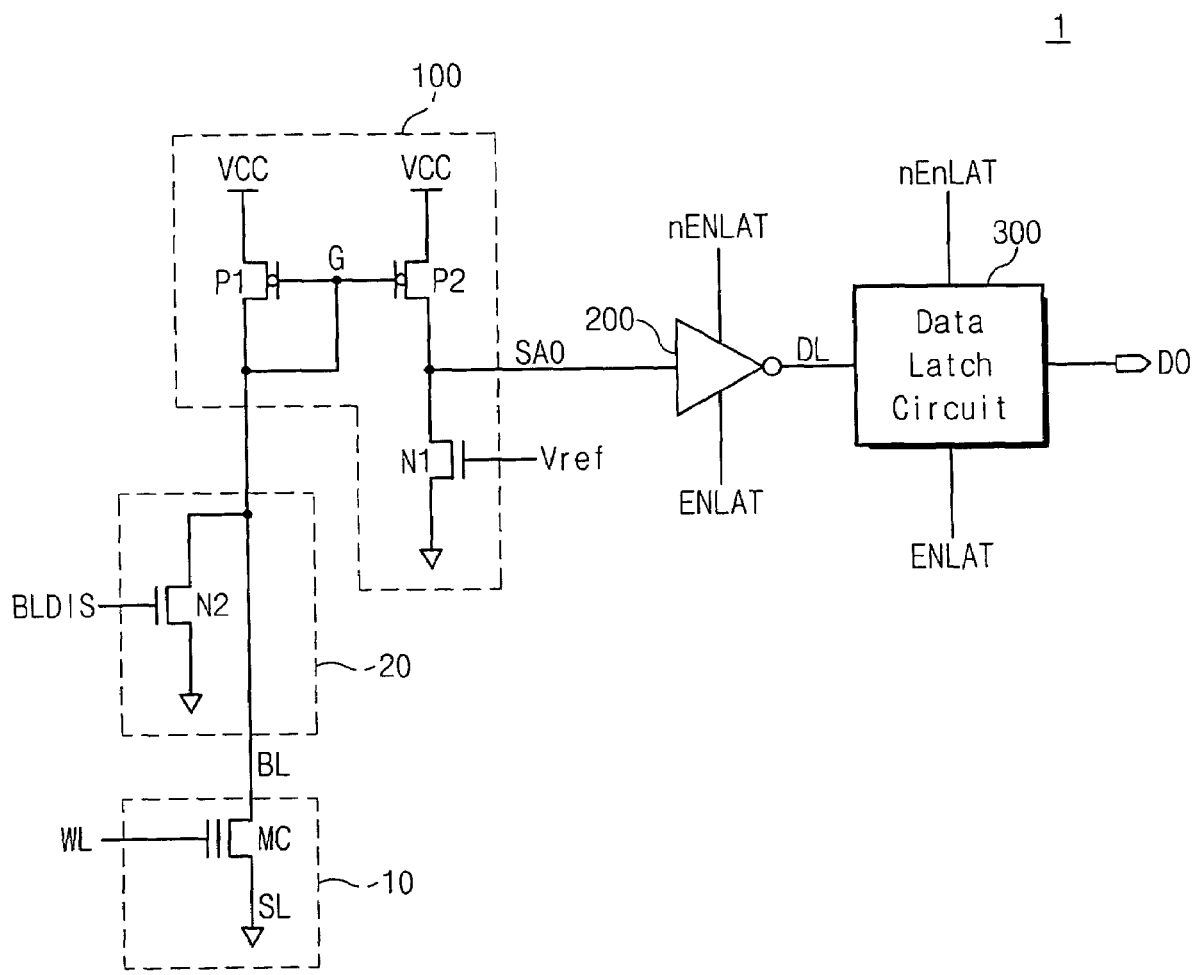
FIG. 1 is a block diagram of a NOR-type flash memory device according to exemplary embodiments of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Moreover, each embodiment described and illustrated herein includes its complementary conductivity type embodiment as well. Like numbers refer to like elements throughout.

It will be understood that when an element is referred to as being "responsive" or "in response to" another element, it can be directly responsive or in response to the other element or intervening elements may be present. In contrast, the term "directly" means there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention will now be described in conjunction with the accompanying drawings. Exemplary embodiments of the present invention will be described in connection with a NOR-type flash memory device. However, embodiments of the present invention may be used with other types of flash memory devices and/or other memory devices, as well.

FIG. 1 is a block diagram showing a NOR-type flash memory device according to exemplary embodiments of the present invention. With reference to FIG. 1, the NOR-type flash memory device 1 includes a memory cell 10, a bitline discharging circuit 20, a sense amplifier circuit 100, a tri-state buffer 200, and a data latch circuit 300.

The memory cell (MC) 10 includes a cell transistor used in a flash memory. The memory cell 10 has a source and drain, which are formed on a P-type semiconductor substrate with a channel region interposed therebetween. In addition, the memory cell 10 includes a floating gate and a control gate. The floating gate may be formed on the channel region with a thin insulating layer of 100 Å or less interposed therebetween. The control gate may be formed on the floating gate with an insulating layer interposed therebetween. Many other configurations of flash memory cells 10 are known to those having skill in the art and need not be described further herein.

The source, drain and control gate electrode of the memory cell 10 and the semiconductor substrate are connected to power terminals in order to apply voltages for programming, erasing, and reading. The control gate is connected to a word line WL. The drain is connected to a bitline BL. The source is connected to a sensing line SL. These and other flash memory cell connections are well known to those having skill in the art and need not be described further herein.

The reading operation is conventionally performed by applying positive voltage (e.g., about 1V) to the drain region of the flash memory cell, a predetermined voltage (e.g., about 4.5V) to a gate, and about 0V to the source region. In the event that the reading operations are performed under the above-mentioned conditions, a programmed cell cuts off a current path from the drain to the source, and an erased cell creates a current path. The programmed cell may be referred to as an "off-cell" and stores data "0". The erased cell may be referred to as an "on-cell" and stores data "1".

The sense amplifier circuit 100 senses and amplifies a current of a bitline BL connected to the memory cell 10. According to whether the memory cell 10 is an off-cell or on-cell, a current amount flowing the bitline BL is changed during the reading operations.

The sense amplifier circuit 100 may include PMOS transistors P1 and P2 for forming a current mirror and an NMOS transistor N1 for receiving a reference voltage Vref. A reference voltage generator circuit (not shown) may provide the reference voltage Vref.

When a gate and a source of the PMOS transistor P2 becomes lower than its threshold voltage, current flows through a current path formed between the source and drain of the PMOS transistor P2. If a current flowing the PMOS transistor P2 becomes larger than a current flowing the NMOS transistor N1, a voltage level on an output node SA0 of the sense amplifier circuit 100 rises. The design and operation of sense amplifiers are well known to those having skill in the art, and need not be described further herein.

The tri-state buffer 200 receives an output (e.g., SA0) of the sense amplifier circuit 100. The tri-state buffer 200 initializes the data latch circuit 300 in response to latch enable signals ENLAT and nENLAT. The latch enable signals ENLAT and nENLAT are complementary. Structures and operations of the tri-state buffer 200 will be described hereinafter with reference to FIG. 2.

The data latch circuit 300 is connected through a data line DL to the tri-state buffer 200. The data latch circuit 300 latches an output value of the tri-state buffer 200 in response to the latch enable signals ENLAT and nENLAT. Structures and operations of the data latch circuit 300 will be described hereinafter with reference to FIG. 3.

The bitline discharging circuit 20 removes charges on the bitline BL before reading data stored in the memory cell 10. The bitline discharging circuit 20 is connected to the bitline BL. The bitline discharging circuit 20 is comprised of an NMOS transistor N2 for discharging the bitline BL in response to a bitline discharging signal BLDIS. A drain of the NMOS transistor N2 is connected to the bitline BL. A source of the NMOS transistor N2 is connected to ground. A gate of the NMOS transistor receives the bitline discharging signal BLDIS.

If the bitline discharging circuit 20 discharges the bitline BL, the PMOS transistor P2 of the sense amplifier circuit 100 becomes turned on. At this time, the output node SA0 of the sense amplifier circuit 100 is set to a logic high level. When the output node SA0 is set to the logic high level, the latch enable signals ENLAT and nENLAT are applied to the tri-state buffer 200. If the latch enable signals ENLAT and nENLAT are applied, the data latch circuit 300 is initialized. In other words, charge on the data line DL at least partially discharges through the tri-state buffer 200.

In general, NOR-type flash memory devices include circuitry for at least partially removing charge on a bitline and a data line before a reading operation. In particular, in order to remove charge on the data line, a control signal and an NMOS transistor may be used. In contrast, NOR-type flash memory devices 1 according to exemplary embodiments of the present invention can at least partially remove charge on a data line DL using latch enable signals ENLAT and nENLAT, which are applied to the tri-state buffer 200 before a reading operation.

Figure 2:
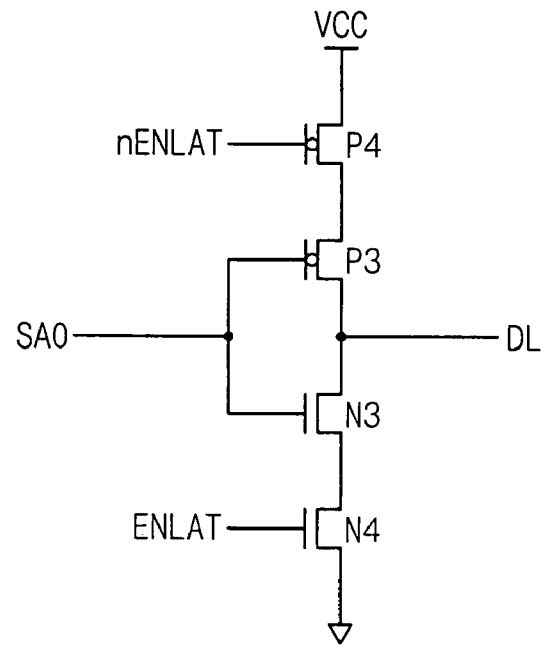
FIG. 2 is a circuit diagram of a tri-state buffer shown in FIG. 1 according to exemplary embodiments of the present invention.

FIG. 2 is a circuit diagram showing an exemplary embodiment of a tri-state buffer shown in FIG. 1. With reference to FIG. 2, the tri-state buffer 200 includes an output node SA0 of the sense amplifier circuit (see FIG. 1) 100 and an inverter connected to the data line DL. The inverter may be embodied by a PMOS transistor P3 and an NMOS transistor N3. The inverter inverts the output value of the sense amplifier circuit 100. Non-inverting tri-state buffers also may be used, in other embodiments of the invention The tri-state buffer 200 is operated in response to latch enable signals ENLAT and nENLAT. The tri-state buffer 200 further includes a PMOS transistor P4 and an NMOS transistor N4. The PMOS transistor P4 is connected between a power supply VCC and the inverter. The NMOS transistor N4 is connected between the inverter and ground. The PMOS transistor P4 receives the latch enable signal nENLAT, and the NMOS transistor N4 receives the latch enable signal ENLAT.

When the output value of the sense amplifier circuit 100 is set to a logic high level, if the latch enable signal ENLAT is activated, at least some charge on the data line DL is removed. That is, at least some charge on the data line DL discharges through NMOS transistors N3 and N4 to ground.

Figure 3:
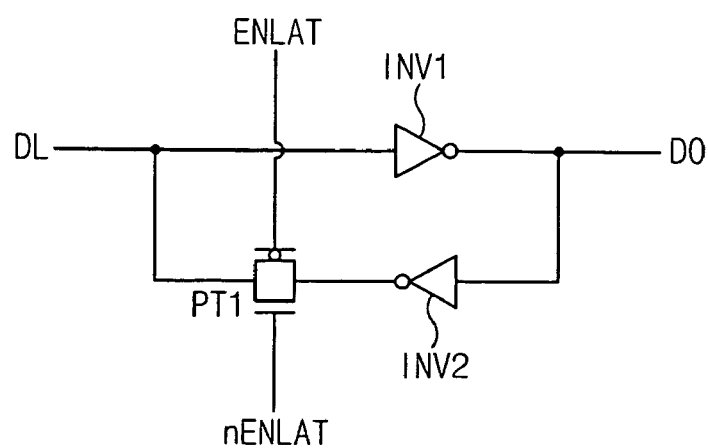
FIG. 3 is a circuit diagram of a data latch circuit shown in FIG. 1 according to exemplary embodiments of the present invention.

FIG. 3 is a circuit diagram showing an exemplary embodiment of a data latch circuit 300 shown in FIG. 1. With reference to FIG. 3, the data latch circuit 300 includes two inverters INV1 and INV2, and a pass transistor PT1.

The inverters INV1 and INV2 latch data input through a data line DL. The pass transistor PT1 becomes turned on in response to the latch enable signals ENLAT and nENLAT. That is, when the latch enable signal nENLAT is activated, the data latch circuit 300 latches the output value of the tri-state buffer 200 (see FIG. 1).

Figure 4:
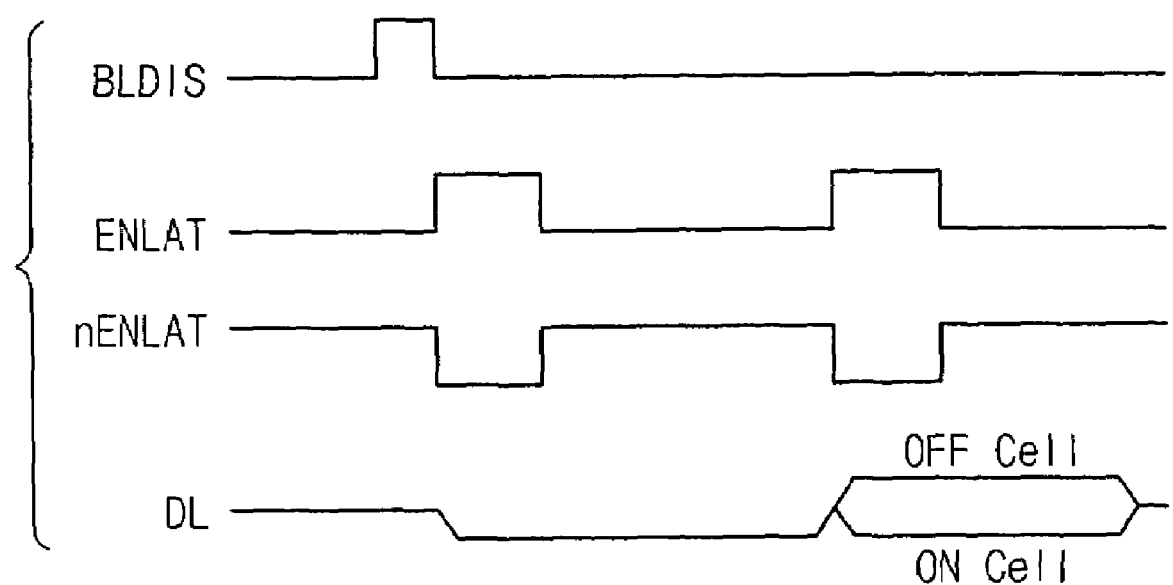
FIG. 4 is a timing diagram showing an operation of NOR-type flash memory device shown in FIG. 1 according to exemplary embodiments of the present invention.

FIG. 4 is a timing diagram showing operations of a NOR-type flash memory device shown in FIG. 1, according to exemplary embodiments of the invention. Hereinafter, the operation of a data line that is discharged before a reading operation will be described with reference to FIGS. 1 and 4.

When a bitline discharging signal BLDIS is activated, an output mode SA0 of the sense amplifier circuit 100 is set to a logic high level. Under this condition, latch enable signals ENLAT and nENLAT are input to a tri-state buffer 200. If the latch enable signals ENLAT and nENLAT are input, charge on a data line DL is at least partially removed.

Next, if the latch enable signals ENLAT and nENLAT are input to the tri-state buffer 200 and the data latch circuit again, the data latch circuit 300 latches an output value of the tri-state buffer 200. As shown in FIG. 4, if a memory cell 10 is a programmed cell (so called "off-cell"), the data line DL is in a high level state. In contrast, if the memory cell 10 is an erased cell (so called "on-cell"), the data line is in a low level state.

In NOR-type flash memory devices 1 according to exemplary embodiments of the present invention, additional circuitry for removing charge on the data line DL may not be needed in an input terminal of the data latch circuit 300. In addition, the NOR-type flash memory device 1 can remove at least some charge on the data line DL by applying latch enable signals ENLAT and nENLAT to the tri-state buffer before a reading operation.

As previously mentioned, flash memory devices according to exemplary embodiments of the invention are capable of removing at least some charge on the data line by applying the latch enable signals to the tri-state buffer before a reading operation. Accordingly, flash memory devices according to exemplary embodiments of the present invention may allow reduced area of the memory device because a data line discharging circuit may not be needed. Moreover, memory devices according to exemplary embodiments of the invention may be capable of obviating the need for a signal for controlling a data line discharging circuit before a reading operation.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A memory device comprising:
   a sense amplifier circuit that is configured to sense and amplify a current of a memory cell;

a tri-state buffer that is configured to receive an output of the sense amplifier circuit;

a data latch circuit that is configured to latch an output of the tri-state buffer; and a data line connecting the tri-state buffer and the data latch circuit, wherein the tri-state buffer is configured to discharge the data line in response to a latch enable signal after a bitline discharge circuit discharges a bitline that is connected to the memory cell.

2. The memory device as set forth in claim 1, wherein the latch enable signal is generated before the data latch circuit latches an output of the tri-state buffer.

3. The memory device as set forth in claim 1, wherein the tri-state buffer includes an inverter that is configured to invert the output of the sense amplifier circuit, and wherein the inverter operates in response to the latch enable signal.

4. The memory device as set forth in claim 1, wherein the data latch circuit operates in response to the latch enable signal.

5. A memory device according to claim 1 wherein the memory device is a NOR-type flash memory device.

6. A memory device comprising:

a memory cell connected to a bitline;

a discharging circuit that is configured to discharge the bitline;

a sense amplifier circuit that is configured to sense and amplify a current of the bitline;

a tri-state buffer that is configured to receive an output of the sense amplifier circuit;

a data latch circuit that is configured to latch an output of the tri-state buffer; and a data line connecting the tri-state buffer and the data latch circuit, wherein the tri-state buffer is configured to discharge the data line in response to the latch enable signal after the bitline discharge circuit discharges the bitline.

7. The memory device as set forth in claim 6, wherein the bitline discharge circuit comprises an NMOS transistor discharging the bitline in response to a bitline discharge signal.

8. The memory device as set forth in claim 6, wherein an output of the sense amplifier circuit is set to a logic high level when the bitline is discharged.

9. The memory device as set forth in claim 6, wherein the latch enable signal is generated before the data latch circuit latches the output of the tri-state buffer.

10. The memory device as set forth in claim 6, wherein the tri-state buffer includes an inverter that is configured to invert the output of the sense amplifier circuit, and wherein the inverter operates in response to the latch enable signal.

11. The memory device as set forth in claim 6, wherein the data latch circuit operates in response to the latch enable signal.

12. A memory device according to claim 6 wherein the memory device is a NOR-type flash memory device.

13. A memory device comprising:

a memory cell;

a sense amplifier circuit that is configured to sense and amplify a current of the memory cell;

a data latch circuit; and a tri-state buffer that is configured to connect an output of the sense amplifier circuit to an input of the data latch circuit;

wherein the tri-state buffer and the data latch circuit are both responsive to a common control signal; and a data line connecting the tri-state buffer and the data latch circuit, wherein the tri-state buffer is configured to discharge the data line in response to the common control signal after a bitline discharge circuit discharges a bitline that is connected to the memory cell.

14. The memory device as set forth in claim 13 wherein the tri-state buffer is configured to discharge the input of the data latch circuit and then to buffer the output of the sense amplifier circuit to the data latch circuit in response to the common control signal.

15. The memory device as set forth in claim 13 wherein the tri-state buffer is configured to discharge the input of the data latch circuit and then to buffer the output of the sense amplifier circuit inverted to the data latch circuit in response to the common control signal.

16. A method of operating a memory device that includes a memory cell, a sense amplifier circuit that is configured to sense and amplify a current of the memory cell, a data latch circuit and a tri-state buffer that is configured to connect an output of the sense amplifier circuit to an input of the data latch circuit, the method comprising:

placing the tri-state buffer in a reduced impedance state to discharge the input of the data latch circuit in response to a common control signal that is applied to both the tri-state buffer and the data latch circuit; and discharging a data line that connects the tri-state buffer and the data latch circuit in response to the common control signal after a bitline discharge circuit discharges a bitline that is connected to the memory cell.

17. A method as set forth in claim 16 wherein placing the tri-state buffer in a high impedance state is followed by:

buffering the output of the sense amplifier circuit to the data latch circuit in response to the common control signal.

18. A method as set forth in claim 17 wherein buffering comprises:

inverting and buffering the output of the sense amplifier circuit to the data latch circuit in response to the common control signal.

* * * * *